United States Patent
Yamada

(10) Patent No.: US 6,200,872 B1
(45) Date of Patent: Mar. 13, 2001

(54) SEMICONDUCTOR SUBSTRATE PROCESSING METHOD

(75) Inventor: Naoki Yamada, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/163,011

(22) Filed: Sep. 30, 1998

(30) Foreign Application Priority Data

Sep. 30, 1997 (JP) .................................................... 9-265273

(51) Int. Cl.$^7$ .................................................... H01L 21/31
(52) U.S. Cl. .................. 438/308; 438/770; 438/556; 438/560; 438/787
(58) Field of Search .............................. 438/17, 455, 766, 438/770, 556, 560, 787, 308, 378

(56) References Cited

U.S. PATENT DOCUMENTS

| | | | |
|---|---|---|---|
| 5,534,446 | * 7/1996 | Tachimori et al. | 438/766 |
| 5,658,809 | * 8/1997 | Nakashima et al. | 438/766 |
| 5,786,231 | * 7/1998 | Warrant et al. | 438/17 |
| 5,856,242 | * 1/1999 | Arai et al. | 438/770 |
| 5,902,135 | * 5/1999 | Shulze | 438/770 |
| 5,966,620 | * 10/1999 | Sakaguchi et al. | 438/455 |

FOREIGN PATENT DOCUMENTS

| | | |
|---|---|---|
| 598694 | * 5/1978 | (CH) . |
| 56-23748 | * 3/1981 | (JP) . |
| 60-133734 | * 7/1985 | (JP) . |
| 61-290709 | * 12/1986 | (JP) . |
| 2-102110 | * 4/1990 | (JP) . |
| 2-148727 | * 6/1990 | (JP) . |

* cited by examiner

Primary Examiner—Mahshid Saadat
Assistant Examiner—José R. Diàz
(74) Attorney, Agent, or Firm—Armstrong, Westerman, Hattori, McLeland & Naughton

(57) ABSTRACT

A purchased silicon substrate 10 is subjected to D-HF treatment, SC-1 treatment, etc. to expose the surface of the silicon substrate 10. Then, the silicon substrate 10 having the surface exposed and containing grown-in defects 12 and micro oxygen precipitates 14 is subjected to oxygen out-diffusion annealing in an argon gas ambient. The annealing is performed, e.g., in an argon gas ambient, at a temperature of about 1000 to about 1300° C. for about 1 hour. Thus, the defects 12, 14 which are near the surface of the silicon substrate 10 are reduced, and the defects in the substrate surface can be decreased.

19 Claims, 17 Drawing Sheets

FIG. 11A
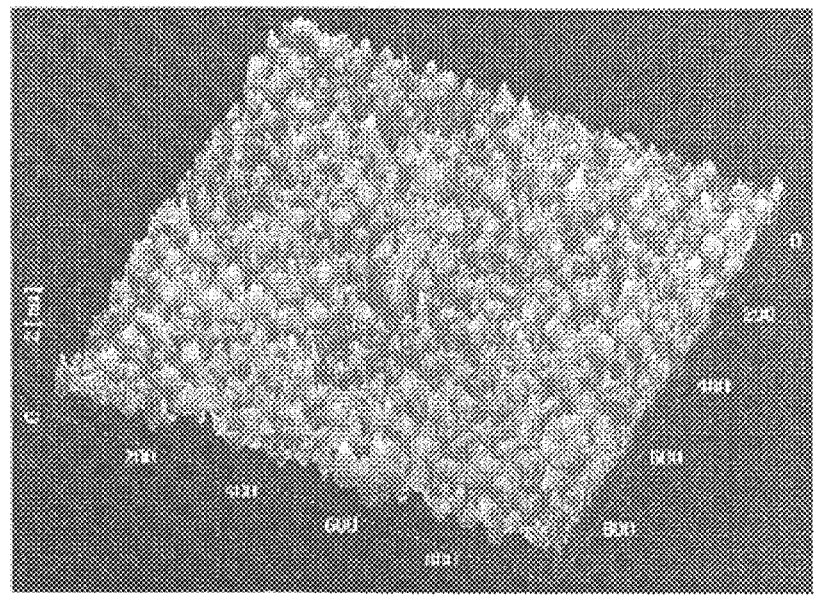
AFTER OUT-DIFFUSION ANNEALING IN
HYDROGEN GAS AMBIENT : Ra=0.169nm
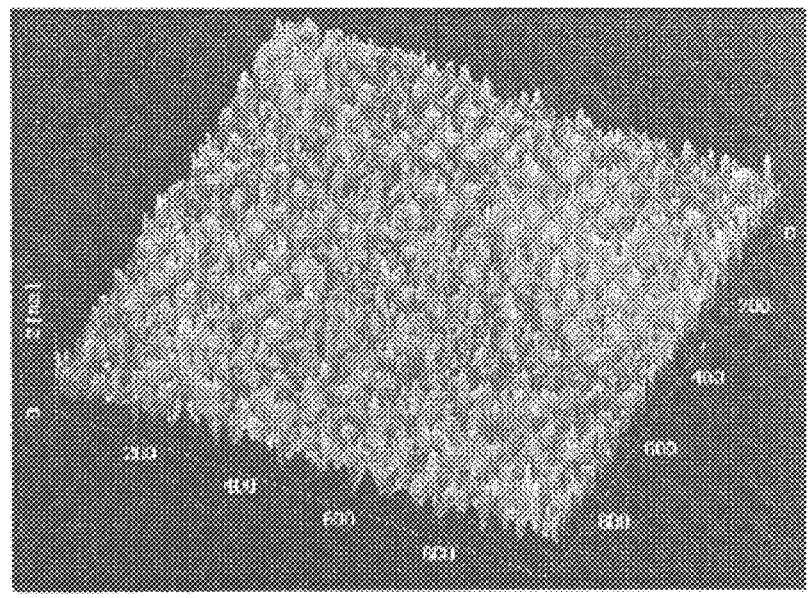
AFTER OUT-DIFFUSION ANNEALING IN
ARGON GAS AMBIENT : Ra=0.170nm
FIG. 11B

SEMICONDUCTOR SUBSTRATE PROCESSING METHOD

BACKGROUND OF THE INVENTION

The present invention relates to a semiconductor substrate processing method, more specifically to a semiconductor substrate processing method for reducing crystal defects causing device failure.

Semiconductor substrates intrinsically contain various impurities and micro crystal defects caused by the various impurities. As micro crystal defects causing device failure, grown-in defects and micro oxygen precipitates have been recently noted. The grown-in defects are called also LSTDs (Laser Scattering Tomography Defects), COPs (Crystal Originated Particles) and FPDs (Flow Pattern Defects), but these names call the same defects. The defects are void-originated defects surrounded by $SiO_2$ film.

As semiconductor devices are more integrated, recently device failure caused by micro crystal defects are a serious problem. For improved yields of devices, reduction of such crystal defects is considered very important.

Prior art for reducing such crystal defects are hydrogen annealing and growth of epitaxial layers without defects on surfaces.

In the hydrogen annealing, as shown in FIG. 16 a silicon substrate 100 containing grown-in defects 102 and micro oxygen precipitates 104 is subjected to oxygen out-diffusion annealing in a hydrogen gas ambient. The silicon substrate 100 is subjected to the annealing, e.g., in the hydrogen gas at 1200° C. for about 1 hour. This annealing makes defects 102, 104 near the surface of the silicon substrate 100 smaller, and defects in the substrate surface are reduced. A device is fabricated on the surface of the silicon substrate 100 having defects reduced.

In the growth of an epitaxial layer, as shown in FIG. 17, a defect-free epitaxial layer 106 is grown on the surface of a silicon substrate 100 containing grown-in defects 102 and micro oxygen precipitates 104. A device is fabricated on the defect-free epitaxial layer 106.

In the hydrogen annealing, however, hydrogen gas is used at a high temperature of 1100–1200° C., and it is very dangerous to use the usual furnace. Accordingly, a special apparatus must be used. The universality lack of the apparatus is a problem.

In the growth of an epitaxial layer the growth of an epitaxial layer needs high costs, which makes wafers expensive. This is a problem. For example, an 8-inch wafer with an epitaxial layer formed on has a price even twice that of a usual wafer.

SUMMARY OF THE INVENTION

An object of the present invention is to provide a semiconductor substrate processing method which includes no dangerous treatment, such as hydrogen annealing, and can effectively reduce defects which will be involved in device failure.

The above-described object can be achieved by a semiconductor substrate processing method comprising the steps of: surface-treating a semiconductor substrate to reduce a thickness of an oxide film on the surface of the semiconductor substrate to not more than 2 nm; loading the semiconductor substrate into a furnace with an ambient of an inert gas, except nitrogen, with keeping a temperature of the semiconductor substrate not more than about 300° C.; and increasing the temperature to a prescribed out-diffusion annealing temperature to out-diffuse impurities in the semiconductor substrate.

In the above-described semiconductor substrate processing method, it is possible that the method further comprises the steps of annealing the semiconductor substrate at a prescribed oxygen precipitation annealing temperature to form oxygen precipitates inside the semiconductor substrate.

In the above-described semiconductor substrate processing method, it is possible that the step of forming the oxygen precipitates is performed before the step of out-diffusing the impurities.

In the above-described semiconductor substrate processing method, it is possible that the step of forming the oxygen precipitates is performed after the step of out-diffusing the impurities.

In the above-described semiconductor substrate processing method, it is possible that the step of forming the oxygen precipitates is performed with the semiconductor substrate covered with an insulation film.

In the above-described semiconductor substrate processing method, it is preferable that the step of forming the oxygen precipitates is performed at a temperature which is not less than about 400° C. and not more than about 1000° C.

In the above-described semiconductor substrate processing method, it is preferable that the step of forming the oxygen precipitates is performed in an inert gas or an oxygen gas ambient.

In the above-described semiconductor substrate processing method, it is preferable that the prescribed out-diffusion annealing temperature is not less than about 1000° C. and not more than about 1300° C.

In the above-described semiconductor substrate processing method, it is preferable that the temperature increase from the temperature at the step of loading the semiconductor substrate into the furnace to the prescribed out-diffusion annealing temperature is performed at a temperature increasing rate of not less than about 3° C./min.

In the above-described semiconductor substrate processing method, it is preferable that the step of out-diffusing the impurities is performed in an ambient of an inert gas having a below 0.1 ppm $O_2$ concentration.

In the above-described semiconductor substrate processing method, it is preferable that the step of out-diffusing the impurities is performed in an ambient of an inert gas having a below 2 ppm $H_2O$ concentration.

In the above-described semiconductor substrate processing method, it is preferable that the step of out-diffusing the impurities is performed in an argon gas ambient.

In the above-described semiconductor substrate processing method, it is preferable that the impurities to be out-diffused in the step of out-diffusing the impurities is oxygen.

BRIEF DESCRIPTION OF THE DRAWINGS

FIGS. 11A and 11B are views showing a surface state of the semiconductor substrate subjected to the out-diffusion annealing observed by atomic force microscope.

DETAILED DESCRIPTION OF THE INVENTION

The semiconductor substrate processing method according to one embodiment of the present invention will be explained with reference to FIG. 1.

A silicon substrate 10 is subjected to D-HF treatment, SC-1 treatment, etc. to expose the surface of the silicon substrate 10. The D-HF treatment is for removing a surface oxide film with a hydrofluoric acid-deionized water mixed liquid. The SC-1 treatment is for rinsing the substrate with an ammonium-hydrogen peroxide-deionized water mixed liquid (SC-1 liquid). To expose the surface of the silicon substrate 10 is to make a film thickness of an oxide film on the surface of the silicon substrate 10 less than about 2 nm.

Figure 1:
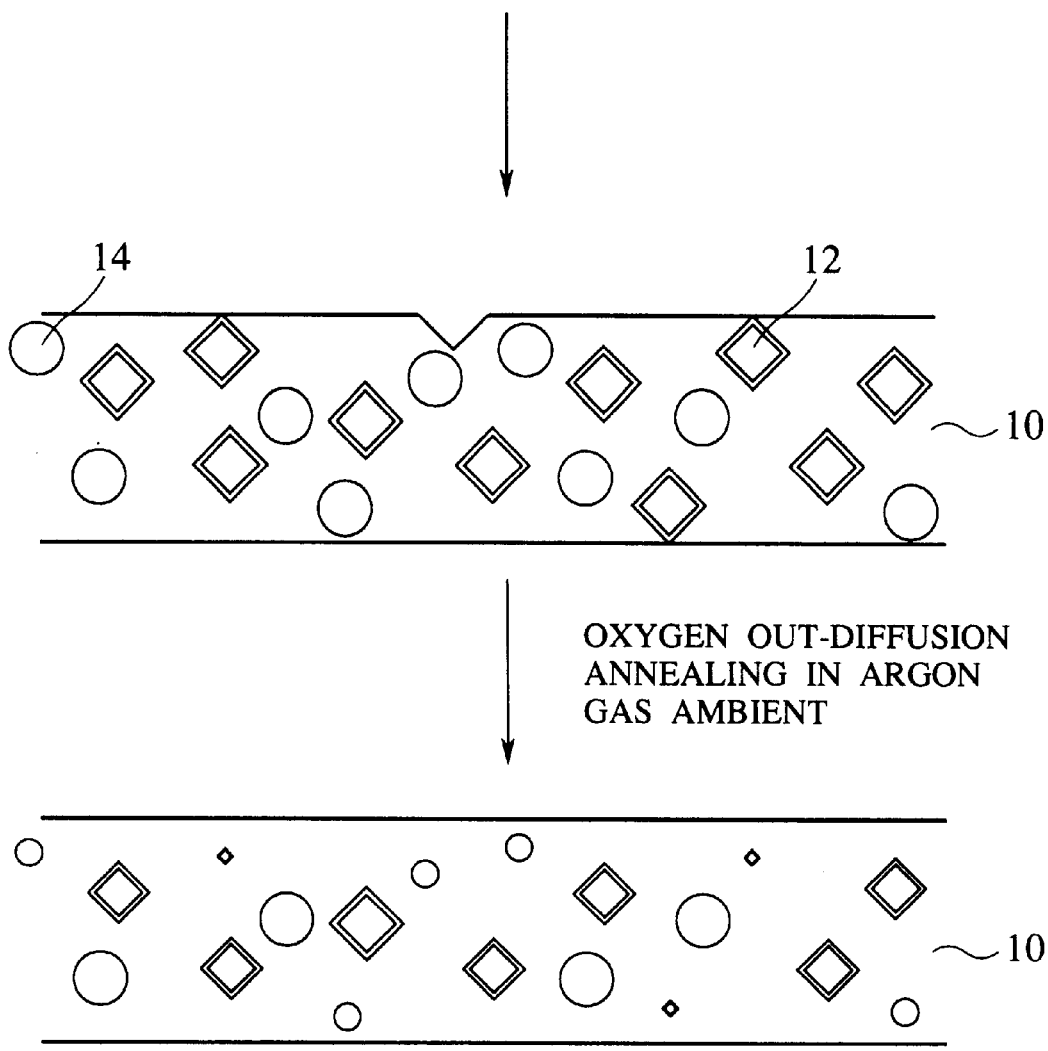
FIG. 1 is a view explaining the semiconductor substrate processing method according to one embodiment of the present invention.

Then, as shown in FIG. 1, the silicon substrate 10 containing grown-in defects 12 and micro oxygen precipitates 14 is subjected to oxygen out-diffusion annealing in an argon gas ambient. The annealing is performed in an argon gas ambient, e.g., for 1 hour at about 1000–1300° C. This annealing reduces defects 12, 14 near the surface of the silicon substrate 10 as in the case that the oxygen out-diffusion annealing is performed in a hydrogen gas ambient, and defects in the substrate surface are reduced.

The silicon substrate is thus treated, whereby the silicon substrate has few defects in the surface and contains inside oxygen precipitates to exhibit IG (Intrinsic Gettering) effect, suitably to fabricate a device.

As another embodiment of the present invention, the oxygen out-diffusion annealing step may be preceded or followed by an annealing step of annealing a silicon substrate for a certain period of time at a temperature lower than an oxygen out-diffusion annealing temperature to intentionally form oxygen precipitates inside the silicon substrate. Oxygen precipitates are thus much formed inside the silicon substrate, whereby the silicon substrate can exhibit higher IG effect.

The oxygen precipitation annealing may be performed with the silicon substrate covered with an insulation film, e.g., an oxide film or others. Thus oxygen precipitates can be formed effectively inside the silicon substrate.

Preferably the oxygen precipitation annealing step is performed at a temperature above about 400° C. but below about 1000° C. The step may be performed in an inert gas ambient or an oxygen gas ambient. Thus oxygen precipitates can be effectively formed inside the silicon substrate.

Figure 2:
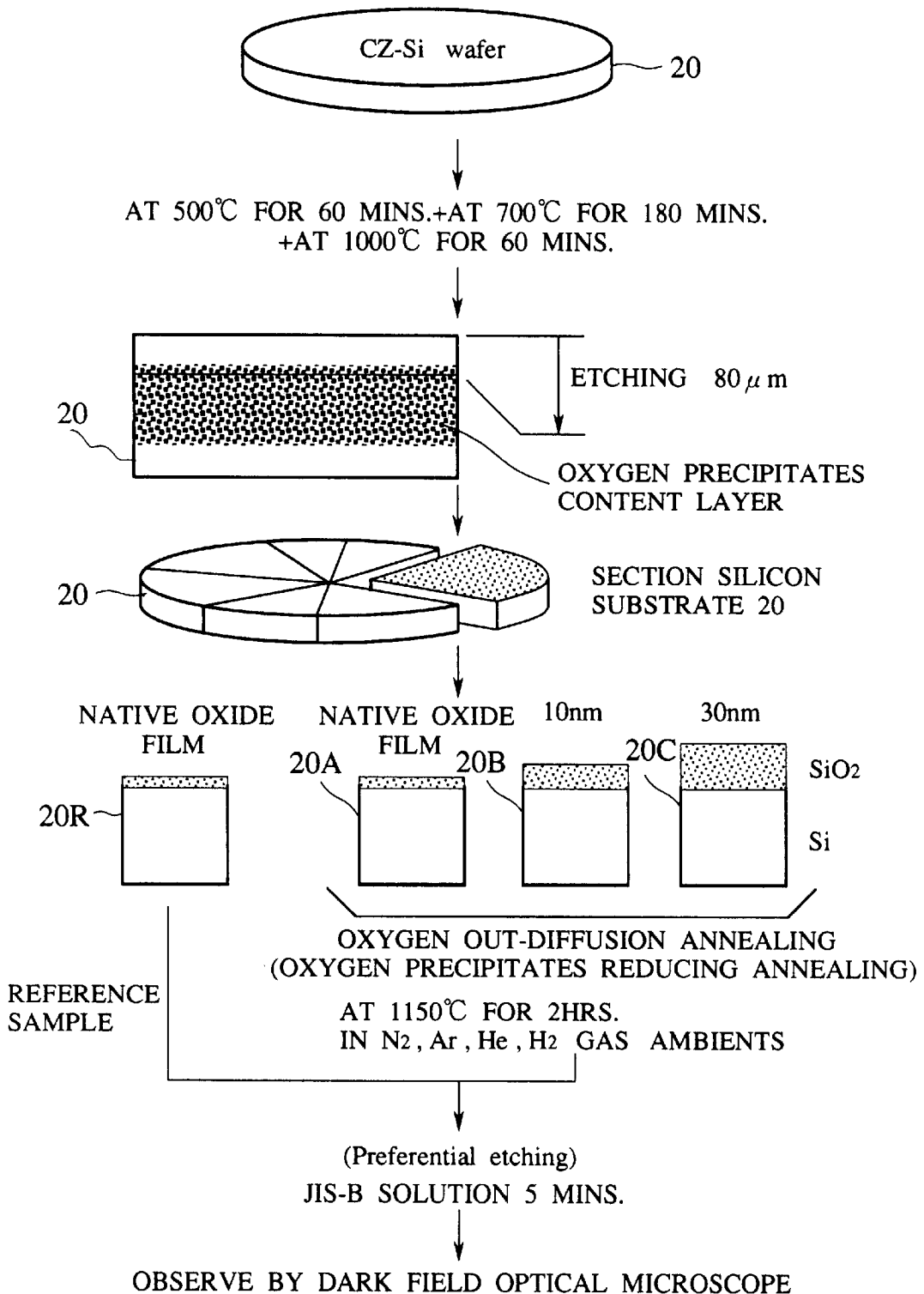
FIG. 2 is a view explaining a procedure of an experiment of checking oxygen precipitates reducing characteristics of the out-diffusion annealing.
Figure 3:
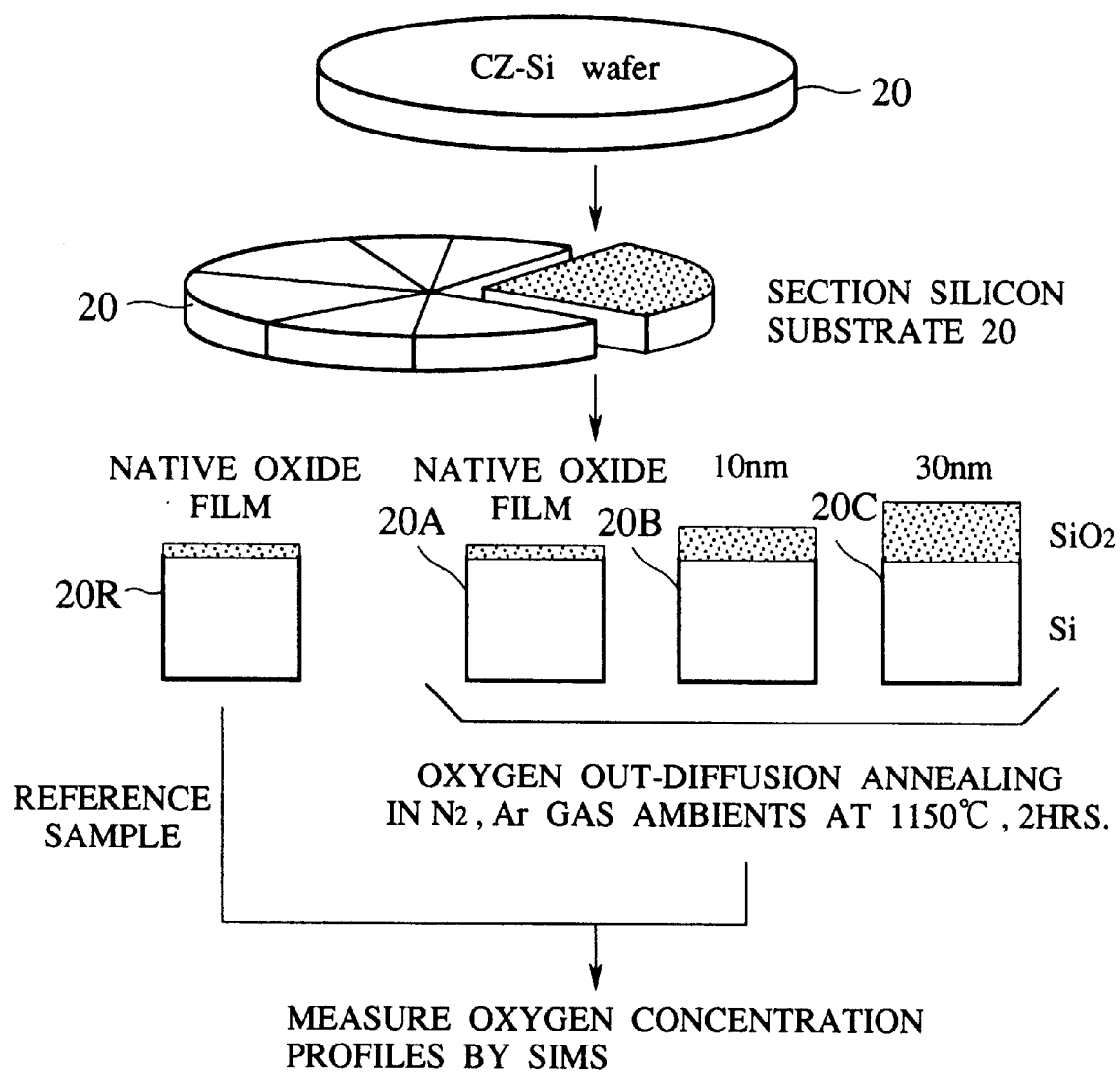
FIG. 3 is a view explaining a procedure of another experiment for checking oxygen precipitates reducing characteristics of the out-diffusion annealing.

The following experiments, as shown in FIGS. 2 and 3, were conducted to check relationships of grown-in defects and micro oxygen precipitates annihilating process with annealing absents and surface oxide films, in the out-diffusion annealing step.

The experiment procedure shown in FIG. 2 will be explained.

A purchased silicon substrate 20 was subjected to an annealing in an ambient of nitrogen and oxygen at 500° C. for 60 minutes, at 700° C. for 180 minutes and at 1000° C. for 60 minutes. Such annealing homogeneously forms oxygen precipitates inside the silicon substrate 20.

Then, the surface of the silicon substrate 20 was etched by about 80 $\mu$m-thick with an etching solution of a hydrofluoric acid and nitric acid mixed liquid to expose the layer containing grown-in defects and micro oxygen precipitates.

Then, the silicon substrate 20 was sectioned into a plurality of pieces as samples. The sectioned samples were divided into those put aside as reference samples 20R and samples for the out-diffusion annealing. Some of the samples for the out-diffusion annealing were put aside as samples 20A each with a native oxide film formed on, which were subjected to no annealing, and the rest samples were annealed to prepare samples 20B each with a 10 nm-thick oxide film formed on, and samples 20C each with a 30 nm-thick oxide film formed on.

The samples 20A, 20B, 20C were subjected to the oxygen out-diffusion annealing at about 1150° C. for about 2 hours in a nitrogen gas ambient, an argon gas ambient, a helium gas ambient and a hydrogen gas ambient.

The samples 20R, and the samples 20A, 20B, 20C subjected to the oxygen out-diffusion annealing were subjected to preferential etching for 5 minutes with JIS solution (HF(50%):HNO$_3$(61%):CH$_3$COOH(99%):H$_2$O=1:15:3:3).

The thus-treated samples 20R, 20A, 20B, 20C had the sectional surfaces observed by a dark field optical microscope for distributions of oxygen precipitates. Grown-in defects were observed down to a 5 $\mu$m-depth of the surface layer by tomography.

Then, the experiment procedure shown in FIG. 3 will be explained.

A purchased silicon substrate 20 was sectioned into a plurality of pieces as samples. The sectioned samples were divided into a reference sample 20R which was put aside and samples to be subjected to the out-diffusion annealing. Some of the samples for the out-diffusion annealing were samples 20A with native oxide film formed on, which were not subjected to the annealing, and the rest samples were subjected to the annealing to be samples 20B with a 10 nm-thick oxide film formed on and samples 20C with a 30 nm-thick oxide film formed on.

The samples 20A, 20B, 20C were subjected to the oxygen out-diffusion annealing at about 1150° C. for about 2 hours respectively in a nitrogen gas ambient and an argon gas ambient.

The thus-treated samples 20R, 20A, 20B, 20C were measured for oxygen concentration profiles in the substrates by a secondary ion mass spectrometer (SIMS).

Figure 4:
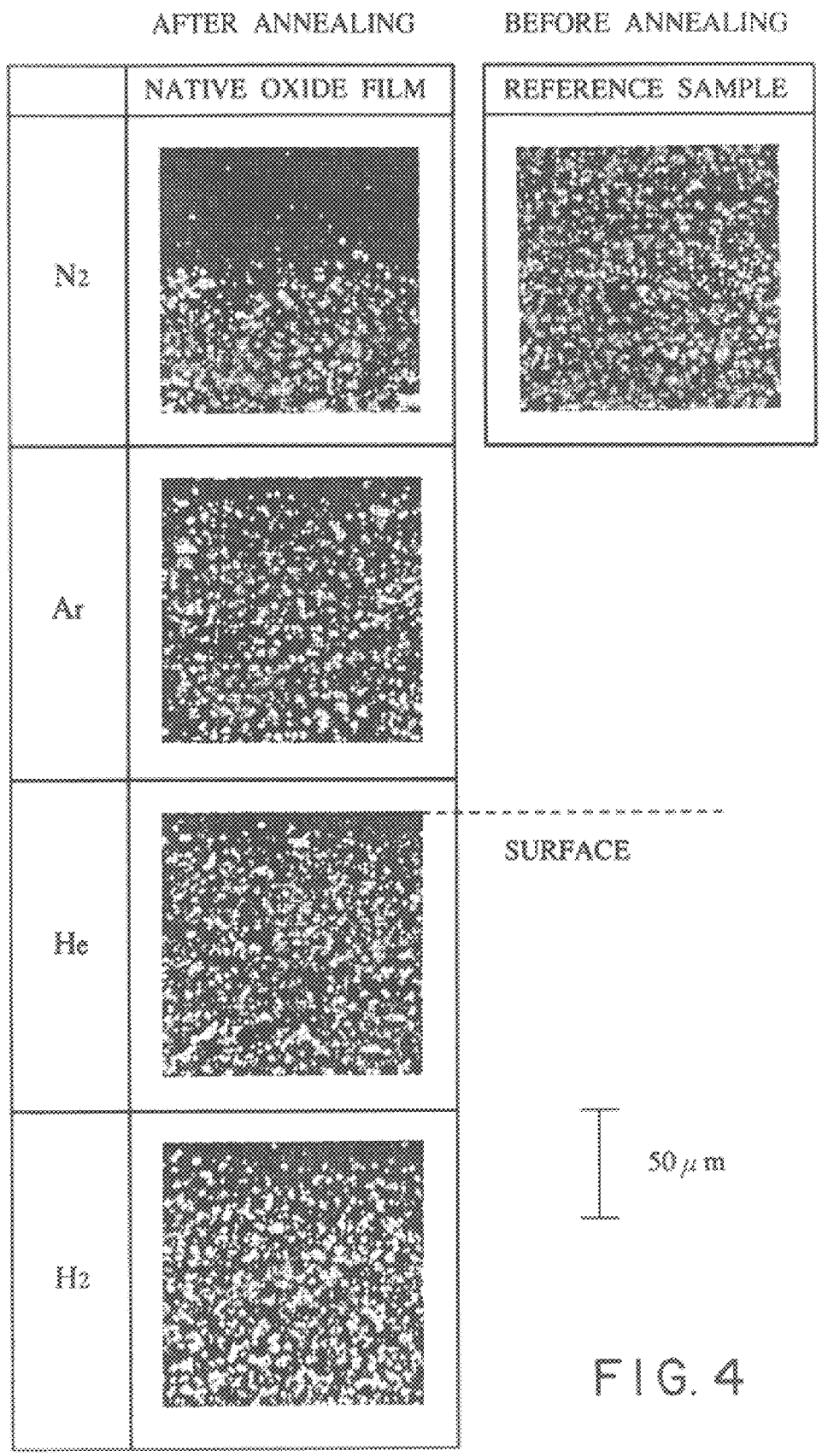
FIG. 4 is views of annihilating states of oxygen precipitates for different annealing absents.

FIG. 4 is a view of annihilating states of the oxygen precipitates in connection with out-diffusion annealing ambients. FIG. 4 shows pictures of the sectional surfaces of the samples 20A with the native oxide film formed on, which were subjected to the oxygen out-diffusion annealing at about 1150° C. for about 2 hours in a nitrogen gas ambient, an argon gas ambient, a helium gas ambient and a hydrogen gas ambient. A picture of the sectional surface of the reference sample 20R is shown for reference.

FIG. 4 shows the effect of reducing oxygen precipitates in the substrate surface is equal in a nitrogen gas ambient, an argon gas ambient and a helium gas ambient to that in a hydrogen gas ambient in comparison with the case without the oxygen out- diffusion annealing. In the cases using an argon gas ambient and a helium gas ambient, the effect of reducing oxygen precipitates was equal to that of the case using a hydrogen gas ambient, but in a nitrogen gas ambient the effect of reducing oxygen precipitates was extended deeper than in a hydrogen gas ambient.

Figure 5:
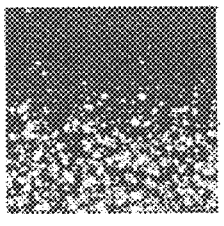
FIG. 5 is views of annihilating states of oxygen precipitates for different surface oxide film thicknesses.

FIG. 5 shows annihilating states of oxygen precipitates for different thicknesses of the surface oxide film. FIG. 5 shows pictures of sectional surfaces of the sample 20A with a native oxide film formed on, the sample 20B with a 10 nm-thick oxide film formed on and the sample 20C with a 30 nm-thick oxide film formed on, which have been subjected to the oxygen out-diffusion annealing in a nitrogen gas ambient and an argon gas ambient. A picture of the sectional surface of the reference sample 20R is shown for reference.

FIG. 5 shows that both in a nitrogen gas ambient and an argon gas ambient, as the silicon oxide film on the surface is thicker, the oxygen out-diffusion is deteriorated, and residual amounts of oxygen precipitates on the surface are larger. In a nitrogen ambient, in the samples 20A, 20B, 20C, depths of reduction of the oxygen precipitates became smaller as the silicon oxide film becomes thicker. In an argon gas ambient as well, the sample 20C, in comparison with the sample 20A, had a smaller depth of reduction of the oxygen precipitates.

Figure 6:
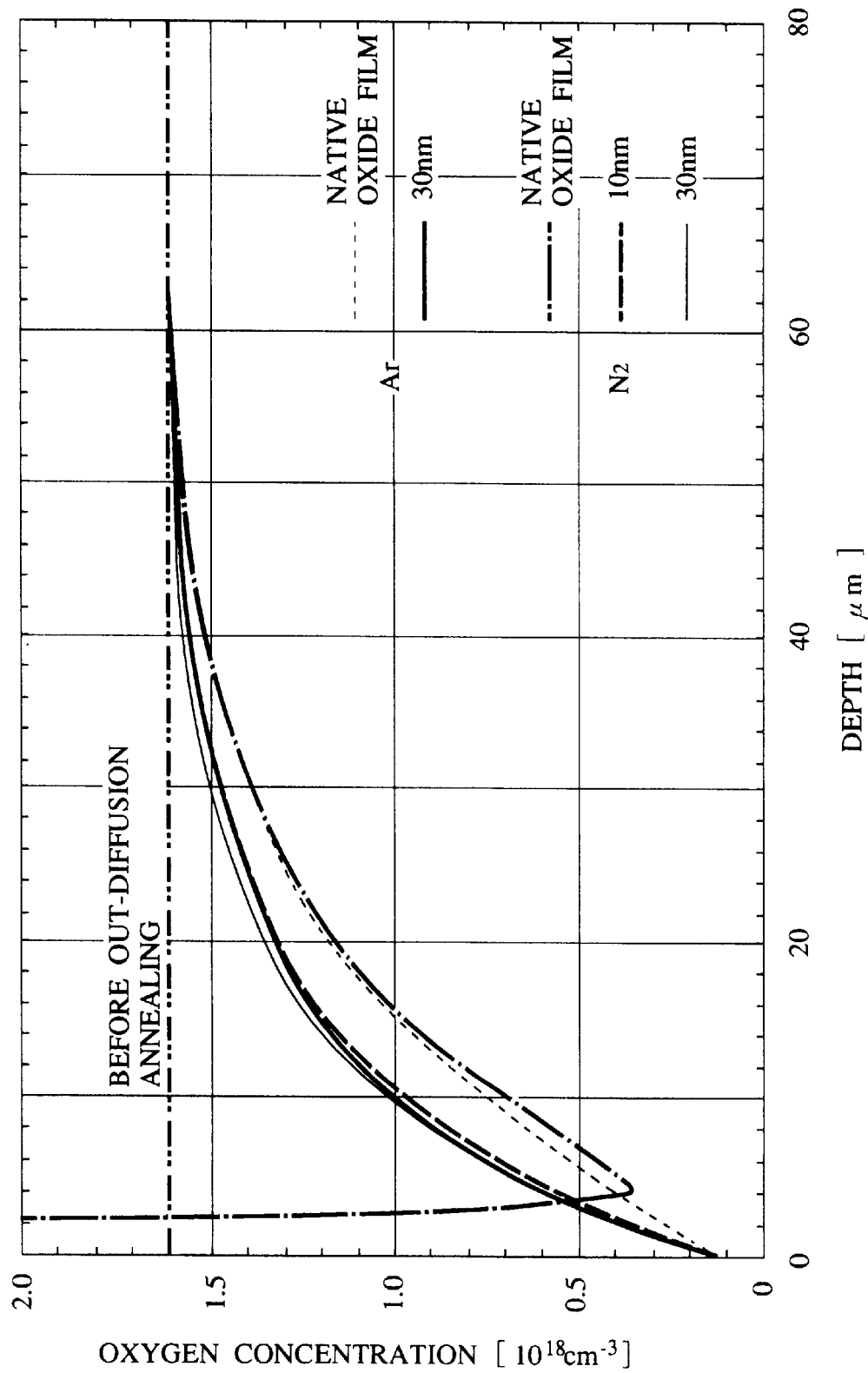
FIG. 6 is a graph of profiles of oxygen concentrations inside a substrate for different surface oxide film thicknesses.

FIG. 6 is a graph of profiles of oxygen concentrations inside the substrate. The oxygen concentration profiles are of the sample 20B with an 10 nm-thick oxide film formed on and the sample 20C with an 30 nm-thick oxide film formed on, which were subjected to the oxygen out-diffusion annealing in a nitrogen gas ambient and an argon gas ambient. An oxygen concentration profile of the reference sample 20R is shown for reference.

FIG. 6 shows that both in a nitrogen gas ambient and an argon gas ambient, the oxygen out-diffusion is enhanced to reduce an oxygen concentration in the surface as the silicon oxide film on the surface becomes thinner. In a nitrogen gas ambient, the sample 20A with native oxide film formed on has higher oxygen-concentration decreasing effect in comparison with the samples 20B, 20C with the oxide films formed on. In the samples 20B, 20C having different oxide film thicknesses, the oxygen concentration profiles are substantially the same. In an argon gas ambient, the sample 20A with native oxide film formed on has higher oxygen-concentration decreasing effect in comparison with the sample 20C with the oxide film formed on. In the graph of the sample 20A in a nitrogen gas ambient, the oxygen concentration abruptly rises in the substrate surface, but this will be due to disturbances of SIMS signal by nitrides in the surface layer.

Based on the results of these experiments, in an argon gas ambient it can be said that oxygen precipitates have substantially annihilated when the oxygen concentration is about $0.8 \times 10^{18}$ $cm^{-3}$. This oxygen concentration value ($0.8 \times 10^{18}$ $cm^{-3}$) has been found based on the results of these experiments.

FIG. 5 shows that in the sample 20A with native oxide film alone formed on oxygen precipitates were substantially annihilated down to an about 12 $\mu$m depth from the surface by the oxygen out-diffusion, but in the samples 20B, 20C with the oxide film formed on oxygen precipitates were not substantially annihilated down to only an about 6 $\mu$m-depth from the surface by the oxygen out-diffusion. The substantial annihilation of the oxygen precipitates down to about 12 $\mu$m depth is very advantageous for device fabrication.

The samples 20R, 20A, 20B, 20C treated as in FIG. 2 were observed by tomograph for grown-in defects in the region down to a 5 $\mu$m-depth from the surface layers. As a result, equal effect of reducing grown-in defects to that in a hydrogen gas ambient was observed in the oxygen out-diffusion annealing in an argon gas ambient.

Based on the results of the above-described experiments and observation, it was found that annihilating process of oxygen precipitates in the substrate surface is decided only by the oxygen out-diffusion annealing. However, in a nitrogen gas ambient atomic vacancies additionally enhance the effect. It was also found that the effect of the oxygen out-diffusion annealing does not depends on annealing ambients but depend only on presence/absence of surface oxide film. In other words, it was found that equal effect of the oxygen out-diffusion annealing to that in a hydrogen gas ambient, which has been conventionally found effective, can be achieved in other ambients, e.g., inert gas ambients as of nitrogen gas, argon gas, helium gas, etc.

The nitrogen ambient causes severe surface roughness due to the nitridation of the surface, and in the following embodiments nitrogen ambient is omitted.

Next, the influence of oxygen mixed in ambients for the oxygen out-diffusion annealing was investigated. A trace of oxygen is mixed in an argon gas ambient, and samples 20A with native oxide alone formed on were subjected to the out-diffusion annealing at about 1150° C. for about 2 hours.

Figure 7:
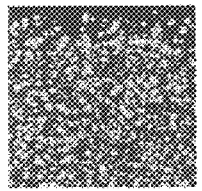
FIG. 7 is views of annihilating states of oxygen precipitates for different mixed-oxygen concentrations in an annealing ambient.

FIG. 7 is a view of annihilating states of oxygen precipitates for different mixed oxygen concentrations in the annealing ambients. The view shows pictures of the sectional surfaces and the surfaces of samples 20A with native oxide film formed on, which have been subjected to the oxygen out-diffusion annealing at about 1150° C. for about 2 hours in argon gas ambients of oxygen concentrations of 0%, 0.25%, 1% and 10%. Film thicknesses of oxide films formed on the surfaces of the substrates subjected to the oxygen out-diffusion annealing are also shown.

In the argon gas ambient of a 0% oxygen concentration, the oxide film after the annealing had a thickness as that of native oxide film, and oxygen precipitates in the substrate surface layer were annihilated. However, in the argon gas ambient of a 0.25% oxygen concentration, the oxide film after the annealing was 14 nm, and the effect of annihilating oxygen precipitates in the substrate surface layer was much deteriorated. In the argon gas ambient of a 1% oxygen concentration the oxide film after the annealing was 22 nm, and effect of annihilating oxygen precipitates in the substrate surface layer was further deteriorated. In the argon gas ambient of a 10% oxygen concentration the oxide film after the annealing was 62 nm, and the effect of annihilating oxygen precipitates was substantially zero and is substantially equal to that of the reference sample 20A. In the argon gas ambient with a trace of oxygen mixed in, it was observed that the substrate surface after the annealing was rough.

Figure 8:
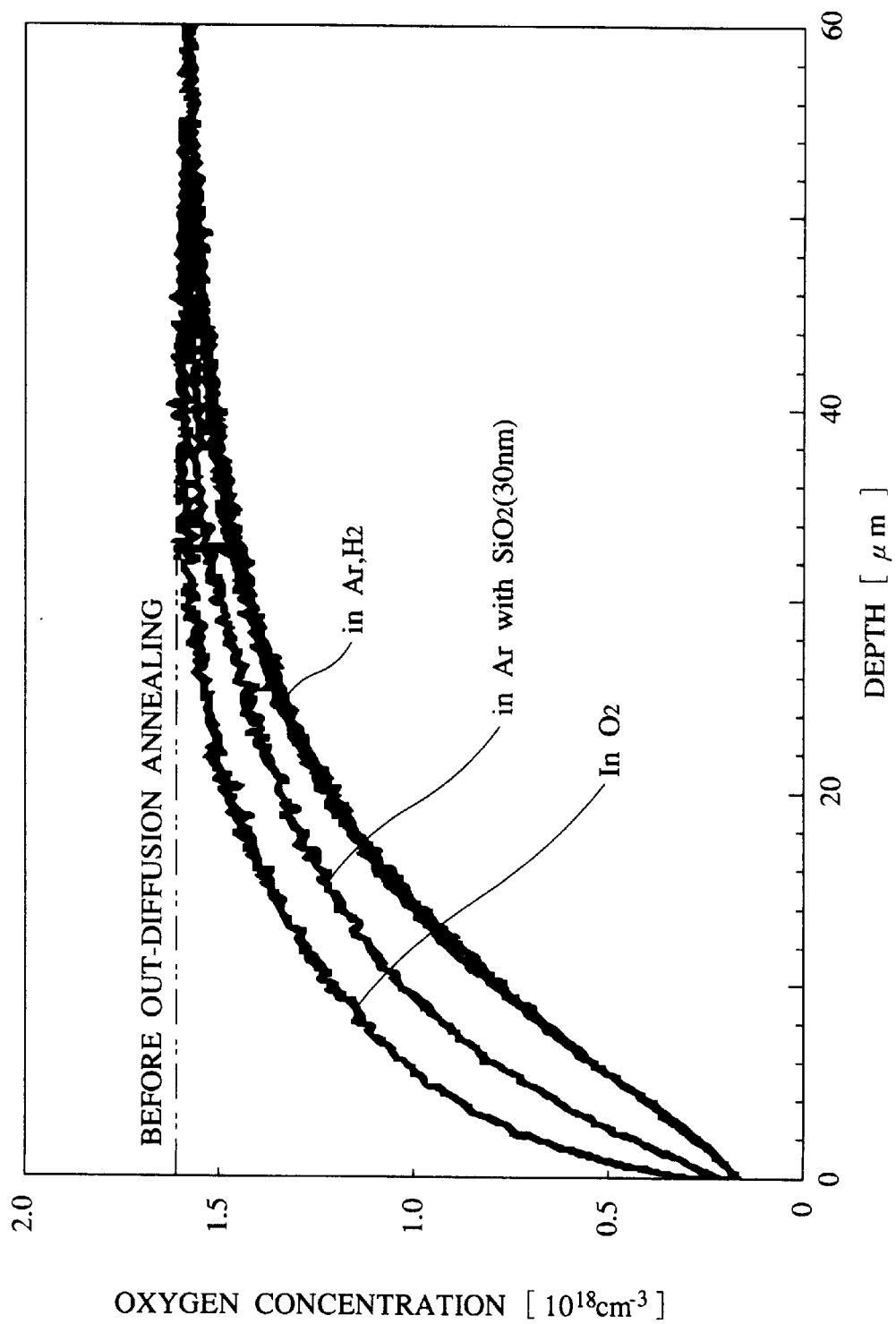
FIG. 8 is a graph of influence of oxygen in annealing absents on oxygen concentration profiles inside the substrate.

FIG. 8 shows a graph of influence of oxygen in annealing ambients on oxygen concentration profiles inside the substrate. The oxygen concentration profiles are of the sample 20A with native oxide film and the sample 20C with the 30 nm-thick oxide film, which were subjected to the oxygen out-diffusion annealing at 1150° C. for 1.5 hours in a hydrogen gas ambient, an argon gas ambient and an oxygen gas ambient.

FIG. 8 shows that the oxygen out-diffusion is enhanced in the hydrogen gas ambient and the argon gas ambient, and an oxygen concentration in the surface is low, but in an oxygen content ambient the oxygen out-diffusion is depressed, and the surface oxygen concentration lowering effect is reduced. The oxygen out-diffusion depression due to the oxygen in the ambients was more in comparison with that in the sample 20C with the oxide film.

It was found that with oxygen mixed in annealing absents the oxygen out-diffusion is much deteriorated. That is, when a mixed oxygen concentration is below 0.05 ppm, oxygen precipitates in the substrate surface layer were effectively annihilated.

The same experiment was made on water mixed in annealing ambients. The same result as that of the experiment on the annealing ambients with oxygen mixed in was obtained. Water mixed in the annealing ambients much deteriorates the oxygen out-diffusion. That is, when a concentration of water to be mixed in is below 1 ppm, oxygen precipitates in the substrate surface are effectively annihilated.

TABLE 1 shows a result of observation, by tomograph, of changes of LSTDs of the surface layer of a 5 μm-depth before and after the out-diffusion annealing.

TABLE 1

|  | After Annealing | Before Annealing |
|---|---|---|
| H$_2$ Ambient | 3.4 × 10$^5$cm$^{-3}$ |  |
| Ar Ambient | 3.2 × 10$^5$cm$^{-3}$ |  |
| O$_2$ Ambient | 8.6 × 10$^5$cm$^{-3}$ |  |
|  |  | 5.2 × 10$^5$cm$^{-3}$ |

As shown in TABLE 1, by the out-diffusion annealing in an argon gas ambient, equal effect of reducing surface layer LSTDs to that produced by the out-diffusion annealing in a hydrogen gas ambient was produced. On the other hand, the annealing in an oxygen gas ambient cannot produce the reducing effect as in the above-described measurement result of the surface layer oxygen precipitates, and reversely surface layer LSTDs increased. This will be because surface layer precipitates formed in ramping-up cannot be reduced by the annealing in the oxygen gas ambient and remain as they are.

Figure 9:
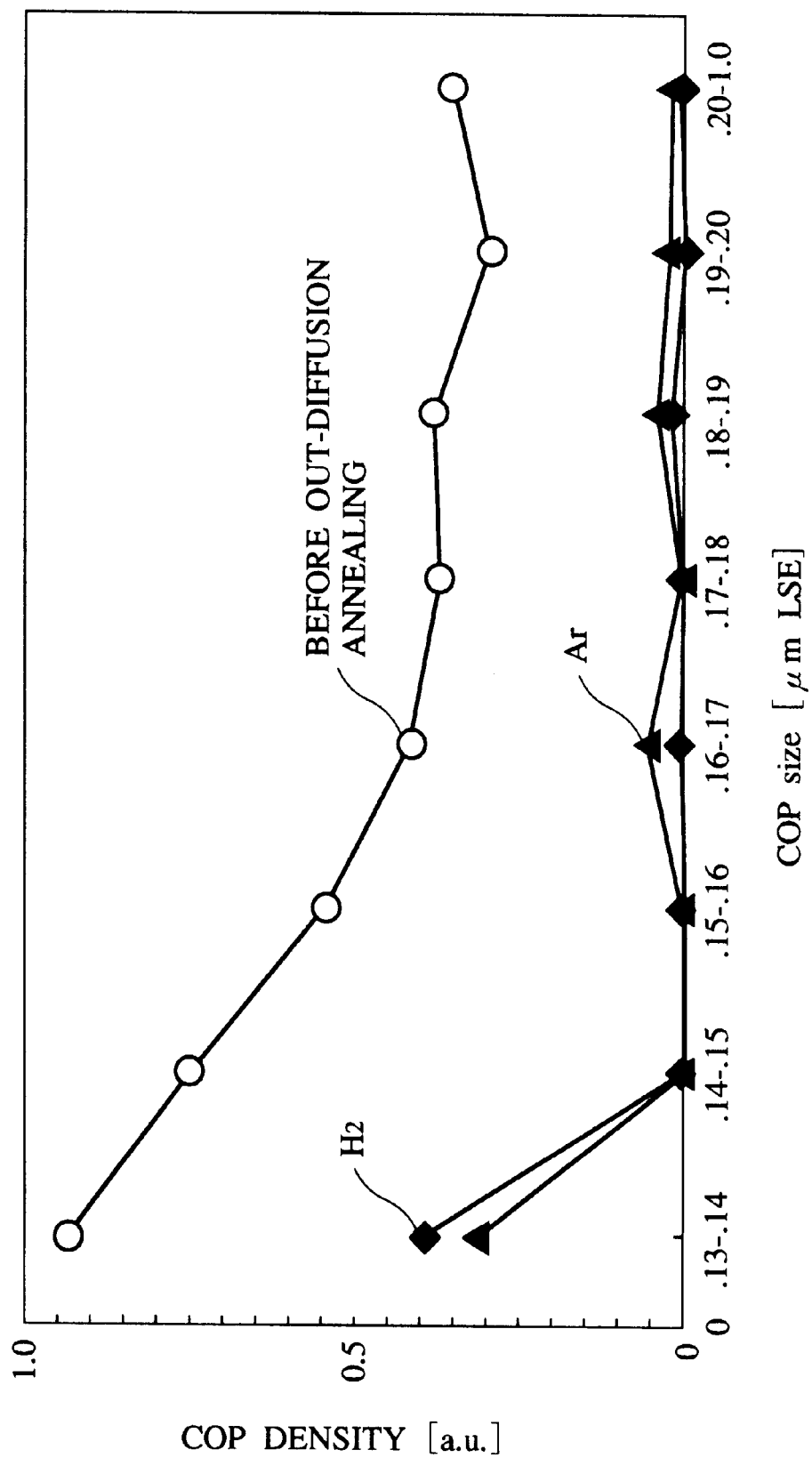
FIG. 9 is a graph of annealing ambient dependency of effect of reducing surface layer COPs.

FIG. 9 is a graph of ambient dependency of effect of reducing surface layer COPs. As shown, the out-diffusion annealing in an argon gas ambient produced equal surface layer COP reducing effect to that produced by the out-diffusion annealing in a hydrogen gas ambient.

Based on the above, annihilation changes of grown-in defects will be determined by the oxygen out-diffusion as in the oxygen precipitates.

The annihilating mechanism of the grown-in defects will have the following two steps. That is, the grown-in defects will be annihilated by the step of dissolving SiO$_2$ film surrounding octahedral voids (grown-in defects) and the step of shrinking the voids by means of agglomeration of interstitial silicon. In the interface between the SiO$_2$ film surrounding the octahedral voids, and the Si matrix, a reaction expressed by

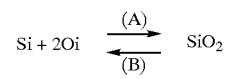

takes place. In this formula, Oi represents interstitial oxygen. Based on a result of SIMS measurement of an experiment based on the SiO$_2$ film and an FZ-silicon substrate, an equilibrium interstitial oxygen concentration in the silicon substrate near the Si/SiO$_2$ interface is estimated to be about 2.9×10$^{17}$ cm$^{-3}$ at 1200° C. When an interstitial oxygen concentration is above the concentration, the reaction (A) is dominant in the above formula, and the reaction (B) is dominant when an interstitial oxygen concentration is below the concentration. Accordingly, when an interstitial oxygen concentration is decreased by the oxygen out-diffusion annealing, the direction of the reaction changes from the growth of the SiO$_2$ film (Reaction (A)) to the dissolution (Reaction (B)), and annihilation of the grown-in defects will be enhanced.

Figure 10:
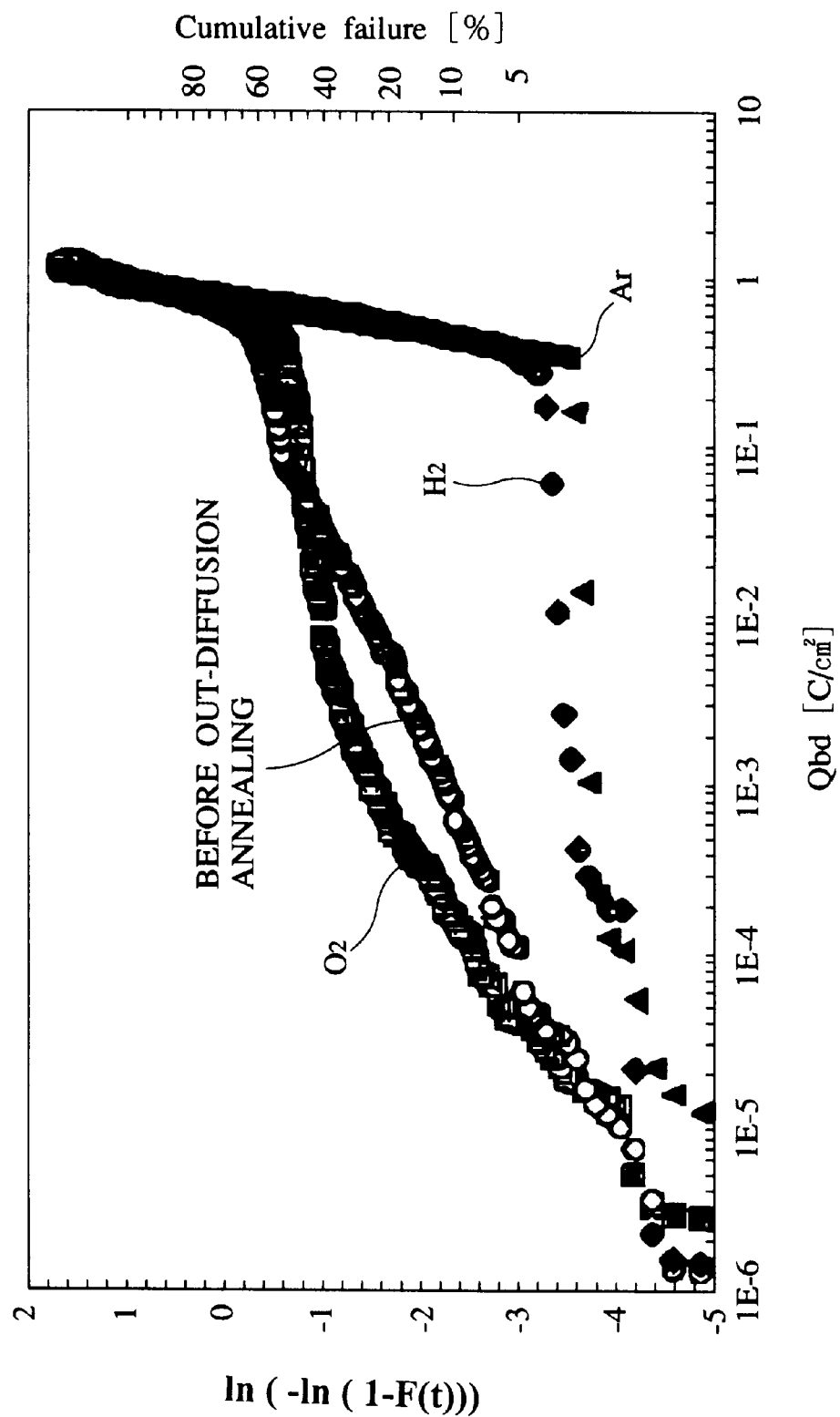
FIG. 10 is a graph of annealing ambient dependency of TDDB characteristics.

FIG. 10 shows comparison of TDDB (Time Dependent Dielectric Breakdown) characteristics of a sample subjected to the oxygen out-diffusion annealing in an argon gas ambient at 1200° C. for 60 minutes, a sample subjected to the oxygen out-diffusion annealing in a hydrogen gas ambient at 1200° C. for 60 minutes and a sample subjected to the oxygen out-diffusion annealing in an oxygen gas ambient at 1200° C. for 60 minutes. Charge to breakdown Qbd [C/cm$^2$] are taken on the horizontal axis. It is meant that as a charge to breakdown Qbd is larger, higher oxide film reliability can be obtained. Cumulative failure ln(-ln(1-F(t))) are taken on the vertical axis. It is meant that as an cumulative failure is larger, a frequency is higher.

Based on the result shown in FIG. 10, it was found that when the oxygen out-diffusion annealing is performed in an argon gas ambient and a hydrogen gas ambient, the oxide film can have drastically improved reliability. That is, ratios of dielectric breakdown of the oxide film determined by its intrinsic life could be improved to about 30% for a sample before the annealing and to above about 90% for samples annealed in an argon gas ambient and a hydrogen gas ambient. This result suggests that the annealing in an argon gas ambient and a hydrogen gas ambient can improve crystal states in the semiconductor substrate surface.

On the other hand, the oxygen out-diffusion annealing in an oxygen gas ambient could not improve the oxide film reliability. As apparent from the result shown in TABLE 1 this will be caused by generation of oxygen precipitates in the surface of the semiconductor substrate.

FIGS. 11A and 11B show views of results of surface states of the semiconductor substrate subjected to the out-diffusion annealing, which were observed by an AFM (atomic force microscope). FIG. 11A is a view showing a surface state of the semiconductor substrate subjected to the out-diffusion annealing in a hydrogen gas ambient at 1200° C. for 1 hour, and FIG. 11B is a view showing a surface state of the semiconductor substrate subjected to the out-diffusion annealing in an argon gas ambient at 1200° C. for 1 hour.

FIGS. 11A and 11B show that the annealing in both absents results in substantially equal roughness.

Although there are reports that the annealing in argon gas ambient deteriorates surface smoothness (refer to e.g., D. Graf, U. Lambert, M. Brohl, A. Ehiert, R. Wahlich, and P. Wagner, J. Electrochem. Soc., 142, 3189 (1955)), the deterioration of smoothness by the annealing in argon gas ambient will be due to residual oxygen in the ambient. That is, it is considered that $SiO_2$ produced and $SiO_2$ film formed on the silicon substrate produced by reaction of the silicon substrate with residual oxygen or water in the annealing ambient volatilizes in the annealing, whereby the surface smoothness is deteriorated. The inventor of the present application has found that smoothness of the surface of a semiconductor substrate can be improved, as is the annihilation of oxygen precipitates, by mixing oxygen of a below 0.05 ppm concentration and water of a below 1 ppm concentration in the ambient.

In order to prevent growth of oxide films and the surface roughness by drawing in gas containing oxygen and water into an annealing ambient, in e.g. a horizontal furnace, a wafer is loaded at room temperature, and after the ambient has been sufficiently replaced by argon, a required temperature increase, the out-diffusion annealing, temperature decrease and unloading of the wafer may be conducted.

Then, one example of the sequence of the semiconductor substrate processing method according to the embodiment of the present invention will be explained with reference to FIG. 12.

In the present embodiment, a silicon substrate is treated in accordance with a sequence including an oxygen precipitation annealing step before an out-diffusion annealing step. To check influence by annealing ambients, the treatments were conducted on the same samples, by the same processing sequence and in an argon gas ambient and a hydrogen gas ambient. The processing sequence is shown in FIG. 12.

First, a purchased silicon substrate is subjected to D-HF treatment, SC-1 treatment, etc. to expose the surface of the silicon substrate.

Figure 12:
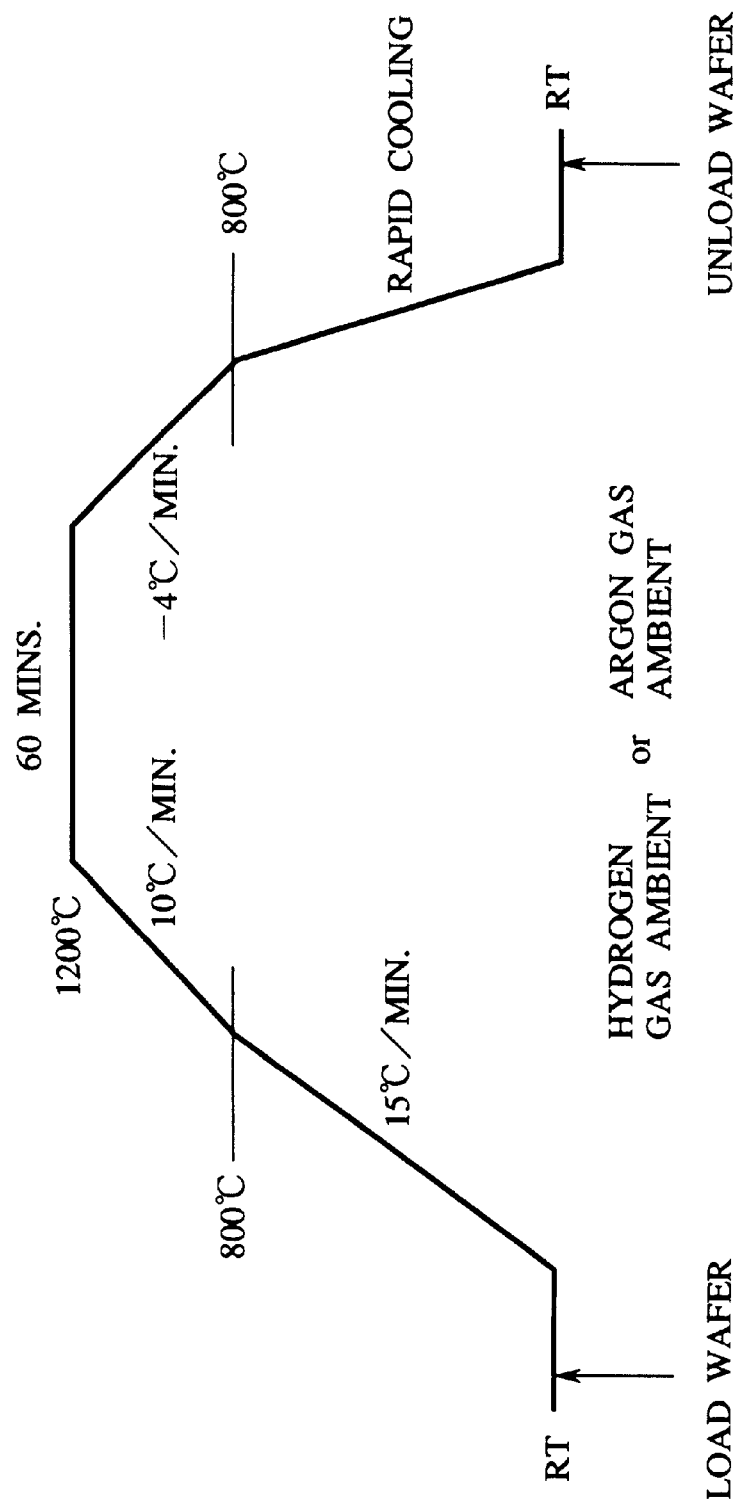
FIG. 12 is a view explaining one example of sequences of the semiconductor substrate processing method according to the embodiment of the present invention.

Next, in accordance with the annealing sequence shown in FIG. 12 the annealing is conducted in a hydrogen gas ambient or an argon gas ambient. First, samples into which the silicon substrate has been sectioned are loaded into a furnace at room temperature (RT), and a hydrogen gas ambient or an argon gas ambient is established in the furnace. Subsequently, the temperature is increased to 800° C. at a 15° C. /min. rate and subsequently increased to 1200° C. at a 10° C./min. rate. This temperature increasing step corresponds to the oxygen precipitation annealing step in which oxygen precipitates are formed inside the silicon substrate.

It is preferable that a ramping rate is set at below 20° C./min. for the prevention of slip in the annealing.

Subsequently, an annealing is performed at 1200° C. for 60 minutes. This annealing step corresponds to the out-diffusion annealing step in which impurities inside the silicon substrate are diffused outside.

Then, the temperature of 1200° C. is decreased to 800° C. at a 4° C./min. rate. Then, the temperature of 800° C. is rapidly decreased to room temperature (RT). The silicon substrate samples are taken out of the furnace which has been rapidly cooled to room temperature.

Figure 13:
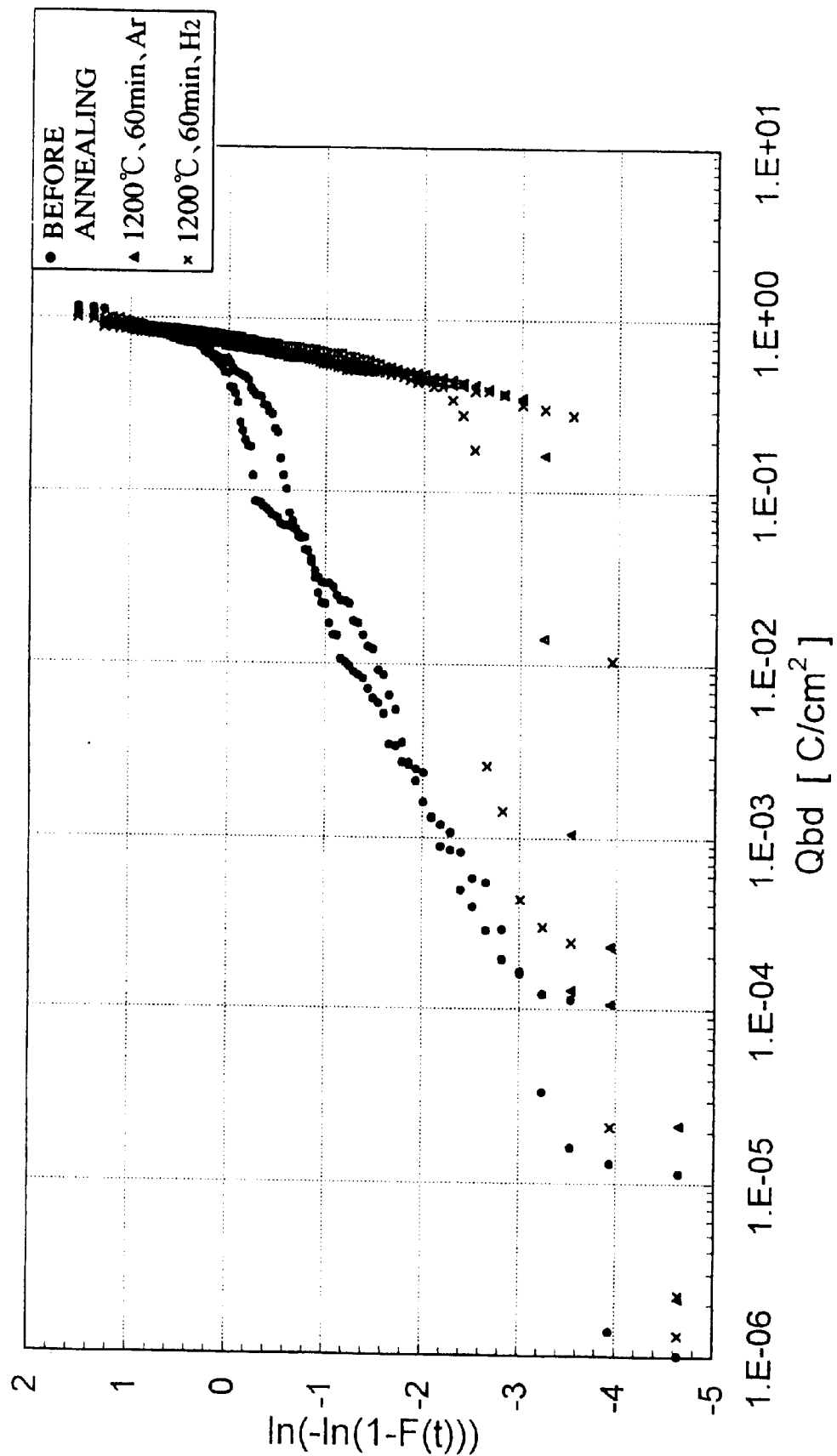
FIG. 13 is a graph of a distribution of TDDB characteristics of a semiconductor substrate processed by the processing sequence of FIG. 12.

FIG. 13 is a graph of a Time Dependent Dielectric Breakdown (TDDB) characteristics of the thus-treated samples. In FIG. 13, ● indicates a measuring point where the samples before out-diffusion annealing were measured. ▲ indicates a measuring point where the samples subjected to the oxygen out-diffusion annealing at 1200° C. for 60 minutes in an argon gas ambient were measured. x indicates a measuring point where the samples subjected to the oxygen out-diffusion annealing at 1200° C. for 60 minutes in a hydrogen gas ambient were measured. The silicon substrates were sectioned into hundred and tens chip samples, charge to breakdown was measured on the respective sample chips. Measured charge to breakdown of oxide film were plotted as shown in FIG. 13.

Based on the measurement result shown in FIG. 13, it is found that charge to breakdown of oxide film is conspicuously improved by the annealing, and in the improvement effect Ar gas ambient and $H_2$ gas ambient are equal to each other.

Next, another example of sequences of the semiconductor substrate processing method according to the embodiment of the present invention will be explained with reference to FIGS. 14 and 15.

Figure 14:
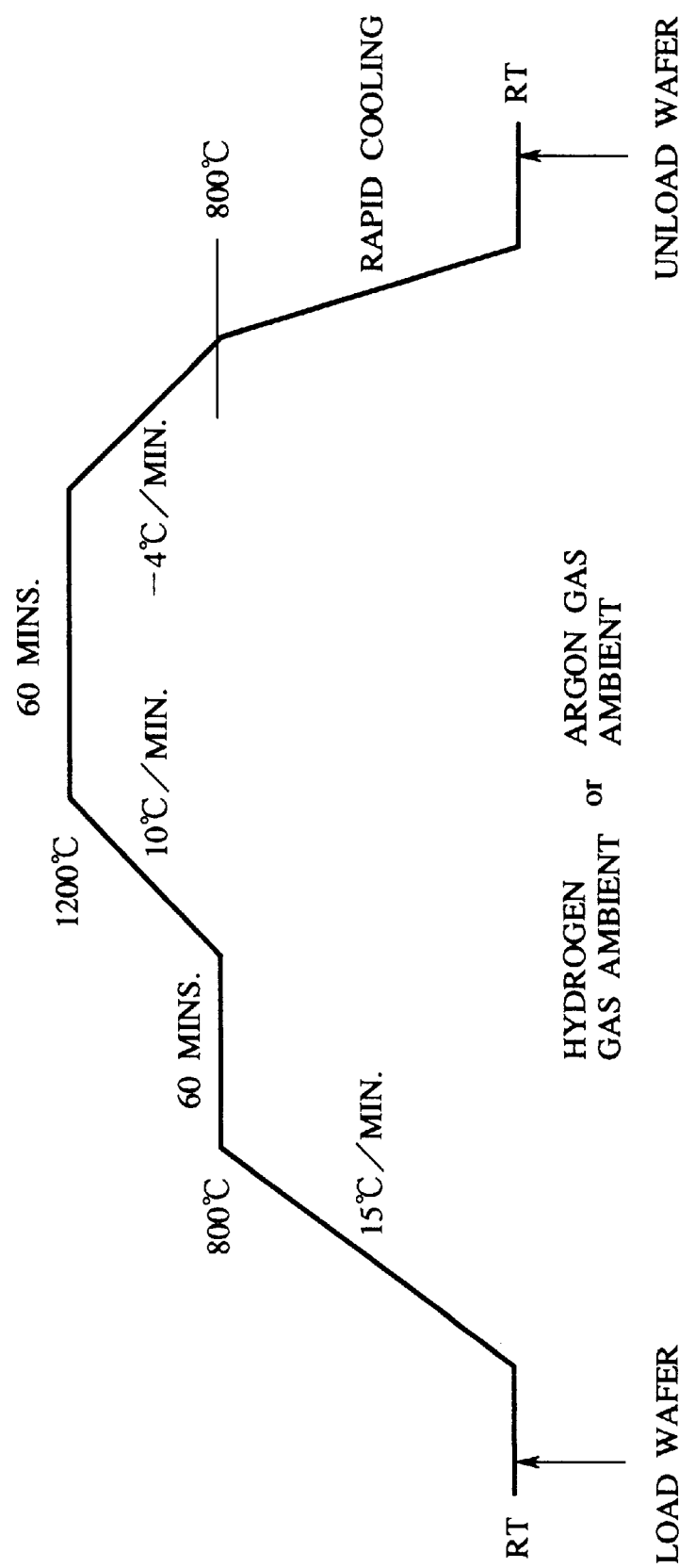
FIG. 14 is a view explaining another example of sequences of the semiconductor substrate processing method according to the embodiment of the present invention.

The processing sequence shown in FIG. 14 includes an oxygen precipitation annealing step before an out-diffusion annealing step.

First, a purchased silicon substrate is subjected to D-HF treatment, SC-1 treatment, etc. to expose the surface of the silicon substrate.

Next, in accordance with the annealing sequence shown in FIG. 14 the annealing is conducted in a hydrogen gas ambient or an argon gas ambient. First, samples into which the silicon substrate has been sectioned are loaded into a furnace at room temperature (RT), and a hydrogen gas or an argon gas ambient is established in the furnace. Subsequently, the room temperature is increased to 800° C. at a 15° C./min. rate. Subsequently an annealing is performed at 800° C. for 60 minutes. This annealing corresponds to the oxygen precipitation annealing step where oxygen precipitates are formed inside the silicon substrate.

Subsequently the temperature of 800° C. is increased to 1200° C. at a 10° C./min. Then, an annealing is performed at 1200° C. for 60 minutes. This annealing corresponds to the out-diffusion annealing step for diffusing outside impurities in the silicon substrate.

Then, the temperature of 1200° C. is decreased to 800° C. at a 4° C/min. Next, 800° C. is rapidly decreased to room temperature (RT). The samples of the silicon substrate are unloaded out of the furnace which has been rapidly cooled to room temperature.

Figure 15:
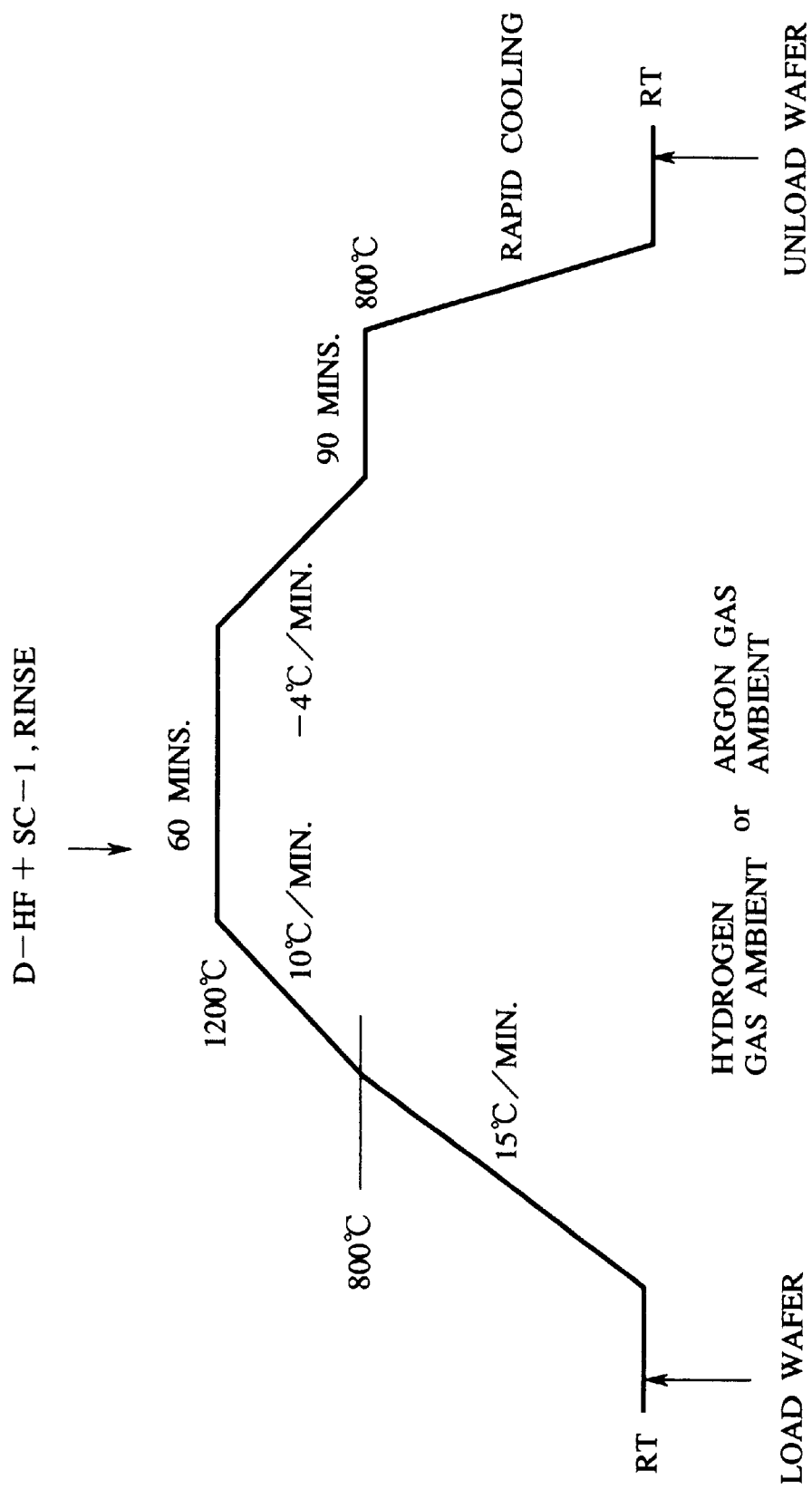
FIG. 15 is a view explaining further another example of sequences of the semiconductor substrate processing method according to the embodiment of the present invention.
Figure 16:
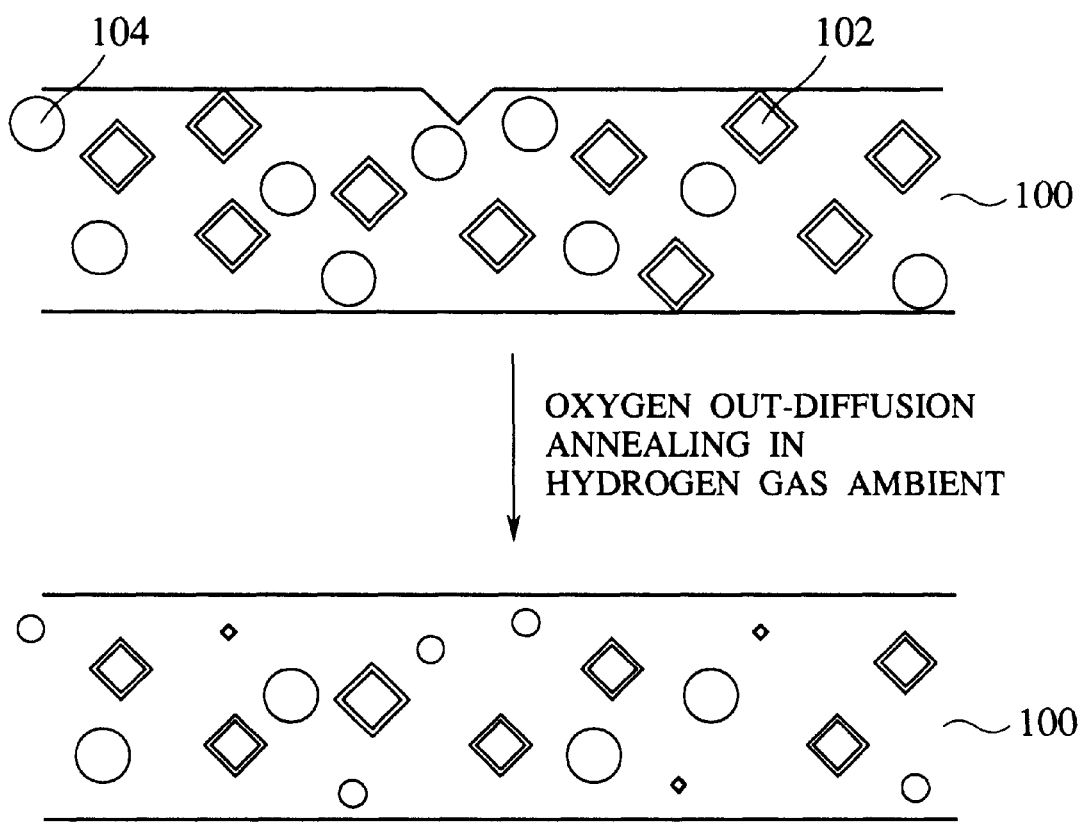
FIG. 16 is a view explaining a conventional semiconductor substrate processing method using hydrogen annealing.
Figure 17:
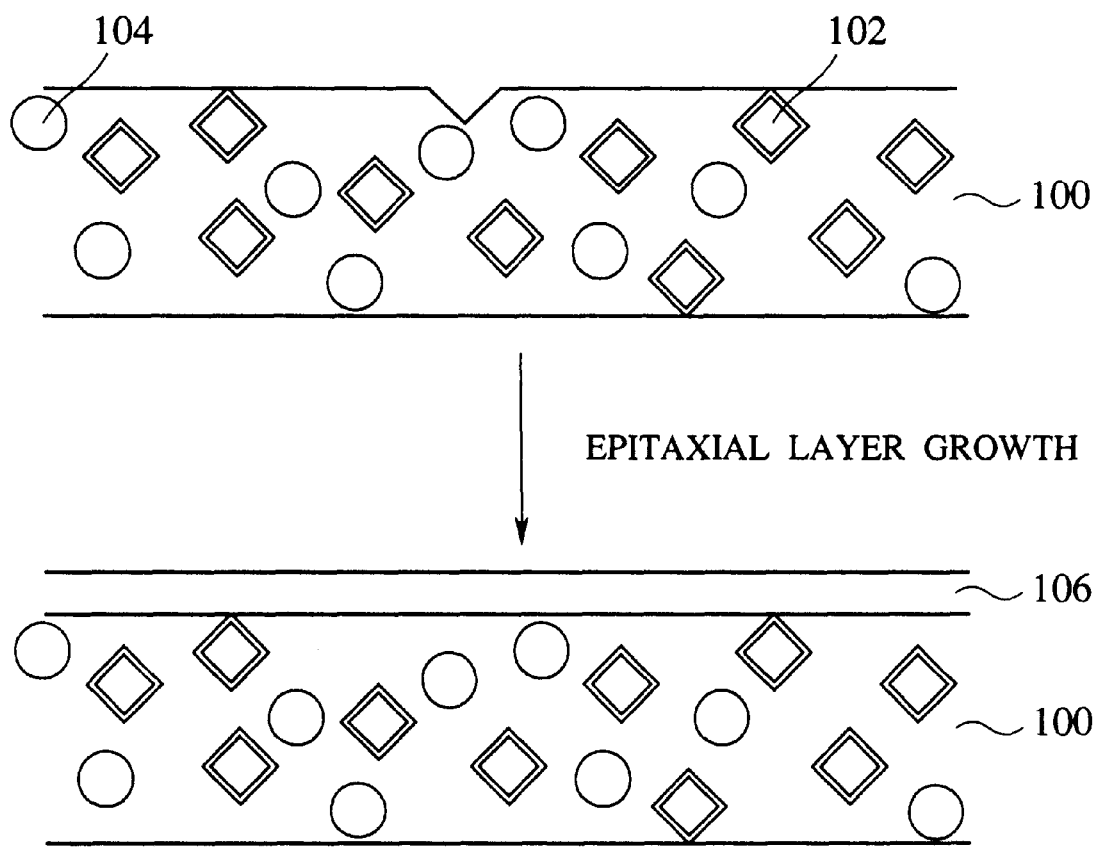
FIG. 17 is a view explaining a conventional semiconductor substrate processing method using growth of an epitaxial layer.

The processing sequence shown in FIG. 15 includes the oxygen precipitation annealing step after the out-diffusion annealing step.

First, a purchased silicon substrate is subjected to D-HF treatment, SC-1 treatment, etc. to expose the surface of the silicon substrate.

Next, in accordance with the annealing sequence shown in FIG. 15 the annealing is conducted in a hydrogen gas ambient or an argon gas ambient. First, samples into which the silicon substrate has been sectioned are loaded into a furnace at room temperature (RT), and a hydrogen gas or an argon gas ambient is established in the furnace. Subsequently, room temperature is increased to 800° C. at a 15° C. /min. rate. Then the temperature of 800° C. is increased to 1200° C. at a 10° C./min. rate.

Then an annealing follows at 1200° C. for 60 minutes. This annealing step corresponds to the out-diffusion annealing step for diffusing outside impurities in the silicon substrate.

Subsequently the temperature of 1200° C. is decreased to 800° C. at a 4° C./min. rate. Then, an annealing is performed at 800° C. for 90 minutes. This annealing corresponds to the oxygen precipitation annealing step for forming oxygen precipitates in the silicon substrate.

Subsequently the temperature of 800° C. is rapidly decreased to room temperature (RT). The silicon substrate samples are unloaded out of the furnace, which has been rapidly cooled.

Thus, an annealing is conducted for a certain period of time at the temperature lower than the oxygen out-diffusion annealing temperature before or after the oxygen out-diffusion annealing step, whereby oxygen precipitates are intentionally formed inside the silicon substrate, and the silicon substrate can more effectively exhibit IG effect.

The present invention is not limited to the above-described embodiments and can cover various modifications.

For example, in the above-described embodiments the out-diffusion annealing was conducted in an argon gas ambient, but may be conducted in an ambient of a different inert gas, such as Ar, He, Ne, Xe, Kr or a mixed gas of them, and may be conducted under reduced pressure. In the above-described embodiment the out-diffusion annealing was explained in connection with a silicon substrate but the out-diffusion annealing may be conducted on other kinds of semiconductor substrates. In the above-described embodiments oxygen was diffused outside, but other impurities may be diffused outside.

What is claimed is:

1. A semiconductor substrate processing method comprising the steps of:

preparing a semiconductor substrate having an oxide film thereon and including micro crystal defects caused by impurities in the semiconductor substrate:

surface-treating the semiconductor substrate to reduce a thickness of the oxide film to not more than 2 nm;

loading the surface-treated semiconductor substrate into a furnace with an ambient of an inert gas, except nitrogen, with keeping a temperature of the semiconductor substrate not more than about 300° C.; and increasing the temperature to a prescribed out-diffusion annealing temperature to out-diffuse impurities in the semiconductor substrate to reduce the micro crystal defects.

2. A semiconductor substrate processing method according to claim 1, further comprising the steps of annealing the semiconductor substrate at a prescribed oxygen precipitation annealing temperature to form oxygen precipitates inside the semiconductor substrate.

3. A semiconductor substrate processing method according to claim 2, wherein the step of forming the oxygen precipitates is performed before the step of out-diffusing the impurities.

4. A semiconductor substrate processing method according to claim 2, wherein the step of forming the oxygen precipitates is performed after the step of out-diffusing the impurities.

5. A semiconductor substrate processing method according to claim 2, wherein the step of forming the oxygen precipitates is performed with the semiconductor substrate covered with an insulation film.

6. A semiconductor substrate processing method according to claim 2, wherein the step of forming the oxygen precipitates is performed at a temperature which is not less than about 400° C. and not more than about 1000° C.

7. A semiconductor substrate processing method according to claim 2, wherein the step of forming the oxygen precipitates is performed in one of an inert gas and an oxygen gas ambient.

8. A semiconductor substrate processing method according to claim 1, wherein the prescribed out-diffusion annealing temperature is not less than about 1000° C. and not more than about 1300° C.

9. A semiconductor substrate processing method according to claim 2, wherein the prescribed out-diffusion annealing temperature is not less than about 1000° C. and not more than about 1300° C.

10. A semiconductor substrate processing method according to claim 1, wherein the temperature increase from the temperature at the step of loading the semiconductor substrate into the furnace to the prescribed out-diffusion annealing temperature is performed at a temperature increasing rate of not less than about 3° C./min.

11. A semiconductor substrate processing method according to claim 2, wherein the temperature increase from the temperature at the step of loading the semiconductor substrate into the furnace to the prescribed out-diffusion annealing temperature is performed at a temperature increasing rate of not less than about 3° C./min.

12. A semiconductor substrate processing method according to claim 1, wherein the step of out-diffusing the impurities is performed in an ambient of an inert gas having a below 0.1 ppm $O_2$ concentration.

13. A semiconductor substrate processing method according to claim 2, wherein the step of out-diffusing the impurities is performed in an ambient of an inert gas having a below 0.1 ppm $O_2$ concentration.

14. A semiconductor substrate processing method according to claim 1, wherein the step of out-diffusing the impurities is performed in an ambient of an inert gas having a below 2 ppm $H_2O$ concentration.

15. A semiconductor substrate processing method according to claim 2, wherein the step of out-diffusing the impurities is performed in an ambient of an inert gas having a below 2 ppm $H_2O$ concentration.

16. A semiconductor substrate processing method according to claim 1, wherein the step of out-diffusing the impurities is performed in an argon gas ambient.

17. A semiconductor substrate processing method according to claim 2, wherein the step of out-diffusing the impurities is performed in an argon gas ambient.

18. A semiconductor substrate processing method according to claim 1, wherein the impurities to be out-diffused in the step of out-diffusing the impurities is oxygen.

19. A semiconductor substrate processing method according to claim 2, wherein the impurities to be out-diffused in the step of out-diffusing the impurities is oxygen.

* * * * *